US012813034B2

(12) United States Patent
Sohn et al.

(10) Patent No.: US 12,813,034 B2
(45) Date of Patent: Nov. 24, 2026

(54) DISPLAY MODULE INCLUDING SELF-LUMINESCENCE ELEMENTS

(71) Applicant: SAMSUNG ELECTRONICS CO., LTD., Suwon-si (KR)

(72) Inventors: Sanghyun Sohn, Suwon-si (KR); Sungjun Koh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 355 days.

(21) Appl. No.: 18/407,064

(22) Filed: Jan. 8, 2024

(65) Prior Publication Data

US 2024/0274759 A1 Aug. 15, 2024

Related U.S. Application Data

(63) Continuation of application No. PCT/KR2023/095094, filed on Nov. 21, 2023.

(30) Foreign Application Priority Data

Feb. 10, 2023 (KR) ........................ 10-2023-0017820

(51) Int. Cl.
*H10H 20/851* (2025.01)
*H10H 20/825* (2025.01)
*H10W 90/00* (2026.01)

(52) U.S. Cl.
CPC ...... *H10H 20/8514* (2025.01); *H10H 20/825* (2025.01); *H10H 20/8512* (2025.01); *H10W 90/00* (2026.01)

(58) Field of Classification Search
CPC ............. H10H 20/8512; H10H 29/851; H10H 29/8517
See application file for complete search history.

(56) References Cited

U.S. PATENT DOCUMENTS 10,185,066 B2 1/2019 Chae et al.
10,361,248 B2 7/2019 Lee et al.
(Continued)

FOREIGN PATENT DOCUMENTS

CN 217405052 U 9/2022
KR 10-2017-0095418 A 8/2017
(Continued)

OTHER PUBLICATIONS

International Search Report dated Feb. 26, 2024 issued by the International Searching Authority in International Application No. PCT/KR2023/095094.
(Continued)

*Primary Examiner* — Evren Seven
(74) *Attorney, Agent, or Firm* — Sughrue Mion, PLLC

(57) ABSTRACT

A display module includes a substrate, and a plurality of pixels provided on the substrate, where each of the plurality of pixels includes a self-luminescence layer, a first color conversion layer, a second color conversion layer, and a third color conversion layer provided on the self-luminescence layer, and a first color filter, a second color filter, and a third color filter respectively provided on the first color conversion layer, the second color conversion layer, and the third color conversion layer, where the self-luminescence layer is configured to emit light of a wavelength that is less than or equal to 460 nm and the first color conversion layer includes a first color conversion material including a turquoise quantum dot or a turquoise phosphor.

16 Claims, 7 Drawing Sheets

(56) References Cited

U.S. PATENT DOCUMENTS

| | | | | |
|---|---|---|---|---|
| 11,004,910 | B2 | 5/2021 | Jung et al. | |
| 11,462,595 | B2 | 10/2022 | Lee et al. | |
| 11,469,403 | B2 | 10/2022 | Joo et al. | |
| 11,672,154 | B2 | 6/2023 | Jung et al. | |
| 2015/0069433 | A1 | 3/2015 | Haase | |
| 2017/0002265 | A1* | 1/2017 | Torimoto | C01B 19/007 |
| 2017/0236866 | A1 | 8/2017 | Lee et al. | |
| 2019/0333964 | A1* | 10/2019 | Lee | H10H 29/142 |
| 2020/0135811 | A1 | 4/2020 | Jung et al. | |
| 2021/0159278 | A1 | 5/2021 | Lee et al. | |
| 2021/0249479 | A1 | 8/2021 | Jung et al. | |
| 2022/0231200 | A1 | 7/2022 | Kim et al. | |
| 2023/0005997 | A1 | 1/2023 | Lee et al. | |
| 2023/0223503 | A1 | 7/2023 | Oohata et al. | |

FOREIGN PATENT DOCUMENTS

| | | | |
|---|---|---|---|
| KR | 10-2019-0007294 | A | 1/2019 |
| KR | 10-2020-0047943 | A | 5/2020 |
| KR | 10-2020-0133086 | A | 11/2020 |
| KR | 10-2021-0065245 | A | 6/2021 |
| KR | 10-2291493 | B1 | 8/2021 |
| KR | 10-2022-0105244 | A | 7/2022 |
| KR | 10-2433877 | B1 | 8/2022 |
| WO | 2021/246068 | A1 | 12/2021 |
| WO | 2022/169059 | A1 | 8/2022 |

OTHER PUBLICATIONS

Written Opinion dated Feb. 26, 2024 issued by the International Searching Authority in International Application No. PCT/KR2023/095094.

Communication dated Nov. 4, 2025, issued by the European Patent Office in European Patent Application No. 23921510.6.

* cited by examiner

DISPLAY MODULE INCLUDING SELF-LUMINESCENCE ELEMENTS

CROSS-REFERENCE TO RELATED APPLICATION(S)

This application is a continuation of International Application No. PCT/KR2023/095094, filed on Nov. 21, 2023, in the Korean Intellectual Property Receiving Office, which is based on and claims priority to Korean Patent Application No. 10-2023-0017820, filed on Feb. 10, 2023, in the Korean Intellectual Property Office, the disclosures of which are incorporated by reference herein in their entireties.

BACKGROUND

1. Field

The disclosure relates to a display module including self-luminescence elements, and more particularly, to a display module including self-luminescence elements emitting a light of a lower wavelength than a blue color and light conversion layers.

2. Description of Related Art

By using self-luminescence elements in a display panel, an image may be displayed without a backlight. A display panel expresses various colors as it operates in pixel or sub-pixel units including self-luminescence elements. Operations of each pixel or sub-pixel are controlled by a thin film transistor (TFT).

In particular, a display module providing an image using self-luminescence elements has a structure where a blue light source or an ultraviolet light source emitting light by self-luminescence elements is light-converted into blue light, red light, and green light through light conversion layers.

In case self-luminescence elements emitting blue light of a wavelength of about 460 nm are applied to a display module, the color conversion layers may include a red color conversion layer where red quantum dots are dispersed on a resin, a green color conversion layer where green quantum dots are dispersed on a resin, and a blue transmission layer to which a transparent resin is applied. In case self-luminescence elements emitting ultraviolet light of a wavelength of 430 nm or lower are applied to a display module, the color conversion layers may include a red color conversion layer where red quantum dots are dispersed on a resin, a green color conversion layer where green quantum dots are dispersed on a resin, and a blue color conversion layer where blue quantum dots (or phosphors) are dispersed on a resin.

In case self-luminescence elements emitting blue light of a wavelength of 460 nm are applied, one issue may be that, as the blue light absorbance of the quantum dots is limited, there is a limitation on the light conversion efficiency, and a large amount of materials should be used for improving the efficiency. Also, self-luminescence elements emitting blue light may include InGaN semiconductor elements, and as the ratio of In increases in the composition of the semiconductor elements, the light emission wavelength may increase. For emitting blue light having a wavelength of 460 nm, In should be about 20% in the cations inside the elements, and the quantum efficiency is restrictive in that composition. Furthermore, as the content of In increases inside the semiconductor elements, the manufacturing cost of the elements increases.

When self-luminescence elements emitting ultraviolet light of a wavelength of 430 nm or lower are applied, as the organic matter constituting the color conversion layer and the optical adhesion layer may generate deterioration of characteristics by the ultraviolet light, of the selection of materials constituting the display structure may be limited. Also, as damage may be caused to human bodies if a small amount of ultraviolet light is leaked in the structure of the display module, there is a problem that the structure design and the display form factor are limited.

SUMMARY

Provided is a display module including self-luminescence elements capable of emitting light of a lower wavelength than a blue color and light conversion layers.

Additional aspects will be set forth in part in the description which follows and, in part, will be apparent from the description, or may be learned by practice of the presented embodiments.

According to an aspect of the disclosure, a display module may include a substrate, and a plurality of pixels provided on the substrate, where each of the plurality of pixels may include a self-luminescence layer, a first color conversion layer, a second color conversion layer, and a third color conversion layer provided on the self-luminescence layer, and a first color filter, a second color filter, and a third color filter respectively provided on the first color conversion layer, the second color conversion layer, and the third color conversion layer, where the self-luminescence layer is configured to emit light of a wavelength that is less than or equal to 460 nm and the first color conversion layer includes a first color conversion material including a turquoise quantum dot or a turquoise phosphor.

The self-luminescence layer may include at least one self-luminescence element configured to emit light of a wavelength greater than 430 nm and less than 460 nm.

The at least one self-luminescence element may be configured to emit light of a wavelength greater than 438 nm and less than 448 nm.

The turquoise quantum dot or the turquoise phosphor of the first color conversion material may be configured to produce a color of a wavelength of greater than 460 nm and less than 550 nm.

The self-luminescence layer may include InGaN semiconductor elements, and a ratio of In:Ga in the InGaN semiconductor elements may be about 1:4.

Each of the plurality of pixels may be configured such that a converted light converted by the first color conversion layer and light that was leaked without being absorbed into the first color conversion layer are mixed to produce a mixed light of a blue color.

A first strength of a first peak wavelength of a spectrum of a first light converted by the first color conversion layer may be 0.5 times to 2 times of a second strength of a second peak wavelength of a second spectrum of a second light that was leaked without being absorbed into the first color conversion layer.

The second color conversion layer may include a second color conversion material configured to emit light of a red wavelength and the third color conversion layer may include a third color conversion material configured to emit light of a green wavelength.

The second color conversion material may include a red quantum dot or a red phosphor and the third color conversion material may include a green quantum dot or a green phosphor.

According to an aspect of the disclosure, a display module may include a substrate and a plurality of pixels provided on the substrate, where each of the plurality of pixels may include a self-luminescence layer comprising a first self-luminescence element, a first color conversion layer corresponding to the first self-luminescence element, and a first color filter corresponding to the first color conversion layer, where the first self-luminescence element is configured to emit light of a wavelength that is less than or equal to 460 nm and the first color conversion layer includes a first color conversion material including a turquoise quantum dot or a turquoise phosphor.

The first self-luminescence element may be configured to emit light of a wavelength between 430 nm and 460 nm.

The first self-luminescence element may be configured to emit light of a wavelength between 438 nm and 448 nm.

The turquoise quantum dot or the turquoise phosphor of the first color conversion material may be configured to produce a color of a wavelength of greater than 460 nm and less than 550 nm.

Each of the plurality of pixels may be configured such that a converted light converted by the first color conversion layer and light that was leaked without being absorbed into the first color conversion layer are mixed to produce a mixed light of a blue color.

A first strength of a first peak wavelength of a spectrum of a first light converted by the first color conversion layer may be 0.5 times to 2 times of a second strength of a second peak wavelength of a second spectrum of a second light that was leaked without being absorbed into the first color conversion layer.

The self-luminescence layer further may include a second self-luminescence element, each of the plurality of pixels may include a second color conversion layer corresponding to the second self-luminescence element and the second color conversion layer may include a second color conversion material configured to emit light of a red wavelength.

The second color conversion material may include a red quantum dot or a red phosphor.

The self-luminescence layer may include a third self-luminescence element, each of the plurality of pixels further may include a third color conversion layer corresponding to the third self-luminescence element and the third color conversion layer may include a third color conversion material configured to emit light of a green wavelength.

The third color conversion material may include a green quantum dot or a green phosphor.

According to an aspect of the disclosure, a pixel of a display module may include a self-luminescence layer, a first color conversion layer, a second color conversion layer, and a third color conversion layer provided on the self-luminescence layer, and a first color filter, a second color filter, and a third color filter respectively provided on the first color conversion layer, the second color conversion layer, and the third color conversion layer, where the self-luminescence layer is configured to emit light of a wavelength that is less than or equal to 460 nm and the first color conversion layer includes a first color conversion material including a turquoise quantum dot or a turquoise phosphor.

BRIEF DESCRIPTION OF DRAWINGS

The above and other aspects, features, and advantages of certain embodiments of the present disclosure will be more apparent from the following description taken in conjunction with the accompanying drawings, in which.

DETAILED DESCRIPTION

Figure 1:
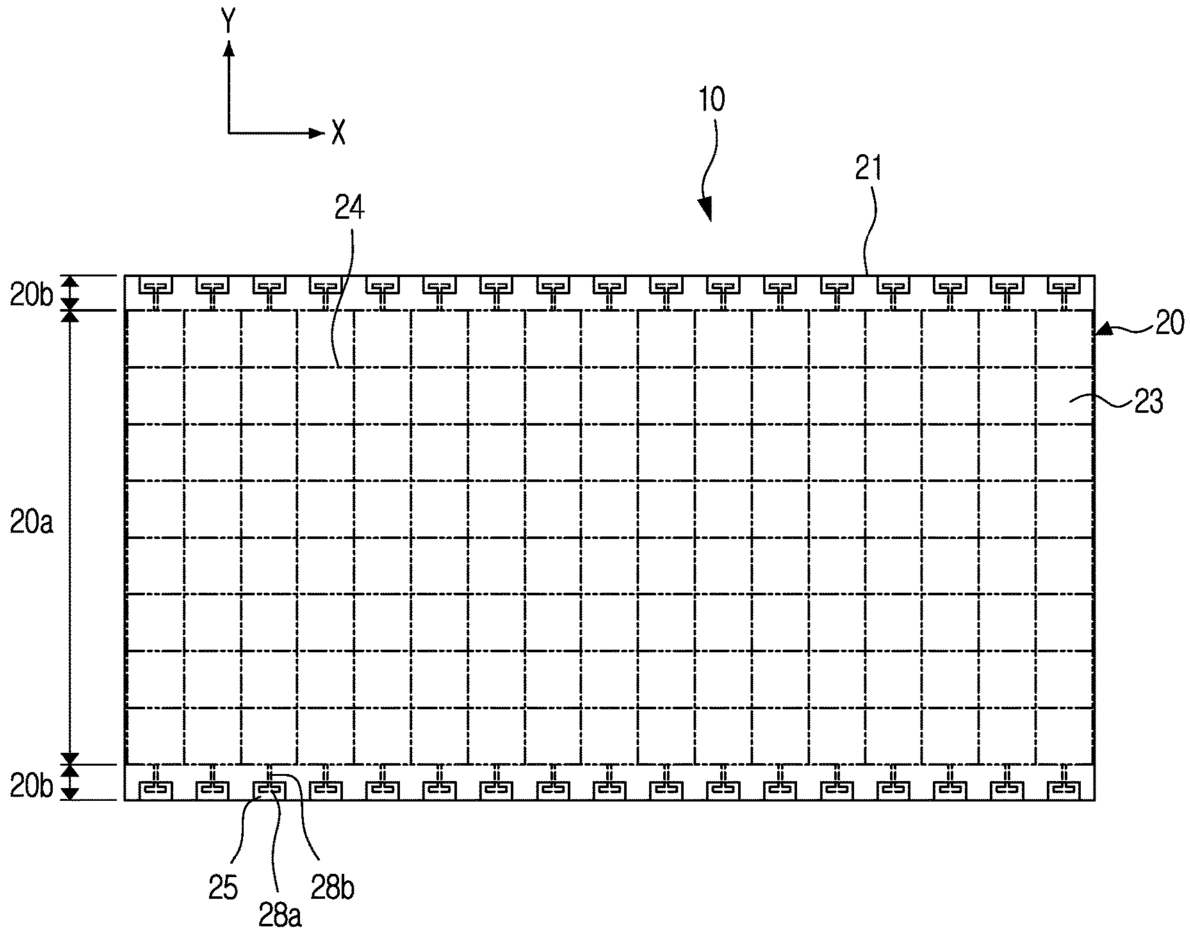
FIG. 1 is a front view illustrating a display module according to an embodiment of the disclosure.

Hereinafter, example embodiments of the disclosure will be described in detail with reference to the accompanying drawings. The same reference numerals are used for the same components in the drawings, and redundant descriptions thereof will be omitted. The embodiments described herein are example embodiments, and thus, the disclosure is not limited thereto and may be realized in various other forms. It is to be understood that singular forms include plural referents unless the context clearly dictates otherwise. The terms including technical or scientific terms used in the disclosure may have the same meanings as generally understood by those skilled in the art.

Terms including ordinal numbers such as 'the first' and 'the second' may be used to describe various components, but these components are not limited by the aforementioned terms. The aforementioned terms are used only for the purpose of distinguishing one component from another component.

Terms such as "include" and "have/has" should be construed as designating that there are such characteristics, numbers, steps, operations, elements, components, or a combination thereof described in the specification, but not as excluding in advance the existence or possibility of adding one or more of other characteristics, numbers, steps, operations, elements, components, or a combination thereof. Also, an element being "coupled with/to" or "connected to" another element may indicate the one element may be directly coupled with/to or connected to the another element, but still another element may exist between the elements. In contrast, the description that one element is "directly coupled" or "directly connected" to another element may indicate that still another element does not exist between the one element and the another element.

The expression 'identical' not only indicates that two components perfectly coincide with each other, but also indicates that a difference to a degree in consideration of a processing tolerance range is included.

Other than the above, in case it is determined that detailed explanation of related known functions or features may unnecessarily confuse the gist of the disclosure, the detailed explanation may be abridged or omitted.

A display module may be a display panel including micro light emitting diodes (LEDs) which are self-luminescence elements for displaying an image. A display module is a kind of flat display panels, and it includes a plurality of inorganic LEDs which are respectively 100 micrometers or smaller, and provides better contrast, response time, and energy efficiency compared to a liquid crystal display (LCD) panel which needs a backlight. In a display module, micro light emitting diodes that are used for displaying an image are self-luminescence elements, and thus there is no need to include a separate backlight.

Organic LEDs (OLEDs) and micro LEDs, which are inorganic LEDs, all have good energy efficiency, but micro LEDs have better brightness and light emitting efficiency, and a longer lifespan than OLEDs. Micro LEDs may be semiconductor chips that may emit light by themselves in case power is supplied. Micro LEDs have fast response speed, low power consumption, and high luminance. For example, micro LEDs have higher efficiency in converting electricity into photons than a conventional LCD or OLEDs. That is, micro LEDs have higher "brightness per watt" than a conventional LCD or OLED display. Accordingly, micro LEDs may exert identical brightness with about half the energy compared to conventional LEDs (of which length, width, and height respectively exceed 100 μm) or OLEDs. Other than this, micro LEDs may implement a high resolution, excellent colors, contrast, and brightness, and thus they may express colors in a wide range correctly, and may implement a clear screen in the outdoors where sunlight is bright. Also, micro LEDs are strong against a burn-in phenomenon and generate little heat, and thus a long lifespan without distortion is guaranteed. Micro LEDs may have a flip chip structure where an anode electrode and a cathode electrode are formed on the same first surface, and light emitting surface is formed on a second surface positioned on the opposite side of the first surface where the electrodes are formed.

One pixel may include at least three sub-pixels. One sub-pixel is a micro self-luminescence element for displaying an image, and may mean a deep blue micro LED. A deep blue micro LED may be a self-luminescence element that emits light of a wavelength band (a wavelength band greater than 430 nm and less than 460 nm) of a smaller wavelength than a blue color (about 460 nm).

One sub-pixel may include one micro self-luminescence element, and also a color conversion layer and a color filter corresponding thereto. The color conversion layer may be excited by light emitted from the micro self-luminescence element, and may emit a color of a specific wavelength band. The color conversion layer may include a material including a nano phosphor or a quantum dot.

On the front surface of a substrate, a thin film transistor (TFT) layer on which a TFT circuit is formed may be arranged, and on the rear surface, a power supply circuit supplying power to the TFT circuit and a data driving driver, a gate driving driver, and a timing controller controlling each driving driver may be arranged. A plurality of pixels arranged on the TFT layer may be driven by the TFT circuit.

For the substrate, a glass substrate, a substrate based on a synthetic resin (e.g., Polyimide (PI), Polyethylene Terephthalate (PET), Polyethersulfone (PES), Polyethylene Naphthalate (PEN), Polycarbonate, etc.), or a ceramic substrate may be used.

On the front surface of the substrate, a TFT layer on which a TFT circuit is formed may be arranged, and on the rear surface of the substrate, a circuit may not be arranged. The TFT layer may be formed integrally on the substrate or manufactured in the form of a separate film, and attached on one surface of the glass substrate.

The front surface of the substrate may be divided into an active area and a dummy area. The active area may be an area occupied by the TFT layer on the front surface of the glass substrate, and the dummy area may be an area excluding the area occupied by the TFT layer on the front surface of the substrate.

The edge area of the substrate may be the outermost area of the glass substrate. Also, the edge area of the substrate may be the remaining area excluding the area where the circuit of the substrate is formed. In addition, the edge area of the substrate may include a portion of the front surface of the substrate adjacent to the side surface of the substrate, and a portion of the rear surface of the substrate adjacent to the side surface of the substrate. The substrate may be formed as a quadrangle type. Specifically, the substrate may be formed as a rectangle or a square. The edge area of the substrate may include at least one side among the four sides of the glass substrate.

The TFT constituting the TFT layer (or a backplane) is not limited to a specific structure or type. For example, the TFT may be implemented as an oxide TFT and an Si TFT (poly silicon, a-silicon), an organic TFT, a graphene TFT, etc., as well as a low-temperature polycrystalline silicon (LTPS) TFT. Also, only a P-type (or an N-type) metal-oxide-semiconductor (MOS) field effect transistor (FET) (MOSFET) may be made in an Si wafer complementary MOS (CMOS) process, and applied.

The pixel driving method of the display module may be an active matrix (AM) driving method or a passive matrix (PM) driving method. The display module may form a pattern of wirings electrically connected to each micro LED according to the AM driving method or the PM driving method.

In one pixel area, a plurality of pulse amplitude modulation (PAM) control circuits may be arranged. In this case, each sub-pixel arranged in the one pixel area may be controlled by a corresponding PAM control circuit. Also, in one pixel area, a plurality of pulse width modulation (PWM) control circuits may be arranged. In this case, each sub-pixel arranged in the one pixel area may be controlled by a corresponding PWM control circuit.

In one pixel area, a plurality of PAM control circuits and a plurality of PWM control circuits may be arranged together. In this case, some of the sub-pixels arranged in the one pixel area may be controlled by the PAM control circuits, and the remaining ones may be controlled by the PWM control circuits. Also, each sub-pixel may be controlled by a PAM control circuit and a PWM control circuit.

The display module may include a plurality of side surface wirings having the thickness of a thin film that are arranged at a specific interval along the side surface of the TFT substrate.

The display module may include a plurality of through wiring members that are formed to be not exposed to the side surface of the TFT substrate instead of side surface wirings that are exposed to the side surface of the TFT substrate. Accordingly, the dummy area is minimized and the active area is maximized on the front surface of the TFT substrate, and thus the display module may become bezeless, and the mounting density of the micro LEDs for the display module may be increased.

In case a plurality of display modules implementing a bezeless structure are connected, a multi display device of a large size where the active area may be maximized may be provided. In this case, as the dummy area of each display module is minimized, the pitch between each pixel of display modules adjacent to each other may be formed to be maintained to be identical to the pitch between each pixel in a single display module. Accordingly, this may be one method of not making a seam recognized in the connection portion between each display module.

A driving circuit may be implemented by a micro integrated circuit (IC) that is arranged in a pixel area and controls the driving of at least 2 pixels. In case a micro IC is applied to the display module, a micro IC and a channel layer connecting each micro LED may be formed instead of a TFT on the TFT layer (or the backplane).

The display module may be installed and applied on wearable devices, portable devices, handheld devices, and electronic products or electronic components which need various kinds of displays in a single unit. Also, the display module may be applied to display devices such as monitors for personal computers (PCs), high resolution televisions (TVs) and signage (or, digital signage), and electronic displays through a plurality of assembly arrangements as a matrix type.

Hereinafter, the display module according to one or more embodiments of the disclosure will be described with reference to the drawings.

Figure 2:
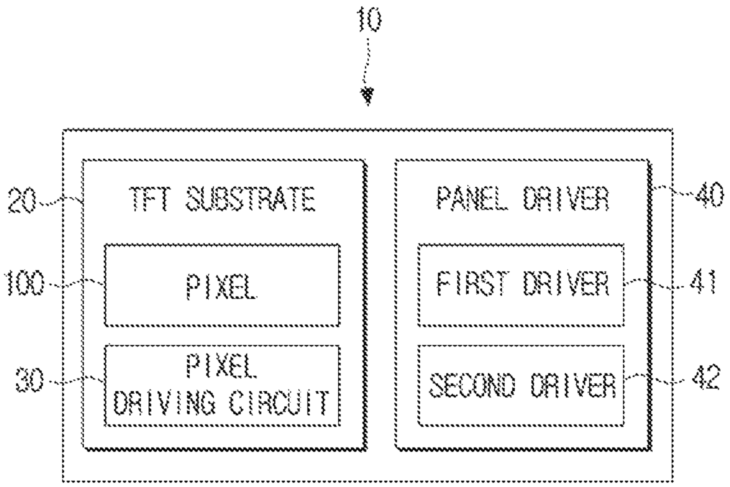
FIG. 2 is a block diagram illustrating a display module according to an embodiment of the disclosure.

FIG. 1 is a front view illustrating a display module according to an embodiment of the disclosure. FIG. 2 is a block diagram illustrating a display module according to an embodiment of the disclosure.

Referring to FIG. 1 and FIG. 2, the display module 10 may include a TFT substrate 20 on which a plurality of pixel driving circuits 30 are formed, a plurality of pixels 100 arranged on the front surface of the TFT substrate 20, and a panel driver 40 that generates a control signal and provides the generated control signal to the plurality of pixel driving circuits 30.

One pixel may include a plurality of sub-pixels. One sub-pixel may include one light source, a color conversion layer and a color filter corresponding to each light source. The light source may be a deep blue micro LED emitting light of a lower wavelength than a blue color. The deep blue micro LED may emit light of a wavelength of greater than 430 nm and less than 460 nm. The structure of the pixels 100 will be described in detail with reference to FIG. 3.

The TFT substrate 20 may include a glass substrate 21, a TFT layer 23 including a TFT circuit on the front surface of the glass substrate 21, and a plurality of side surface wirings 25 that electrically connect the TFT circuit of the TFT layer 23 and circuits arranged on the rear surface of the glass substrate 21.

As an alternative of the glass substrate 21, a substrate based on a synthetic resin having a flexible material (e.g., PI, PET, PES, PEN, Polycarbonate, etc.), or a ceramic substrate may be used.

The TFT substrate 20 may include an active area **20*a* that displays an image, and a dummy area 20*b*** that does not display an image on the front surface.

The active area **20*a* may be partitioned into a plurality of pixel areas 24 where each of the plurality of pixels is arranged. The plurality of pixel areas 24 may be partitioned in various forms, and as an example, they may be partitioned in a matrix form. In one pixel area 24, one pixel 100 (FIG. 3**) may be included.

The dummy area **20*b* may be included in an edge area of the glass substrate 21, and a plurality of contact pads 28*a* may be arranged at a specific interval. Each of the plurality of contact pads 28*a* may be electrically connected with each pixel driving circuit 30 through a wiring 28*b***.

The number of the contact pads **28*a* formed in the dummy area 20*b* may vary according to the number of the pixels implemented on the glass substrate, and may also vary according to the driving method of the TFT circuit arranged in the active area 20*a*. For example, compared to a case of the PM driving method where the TFT circuit arranged in the active area 20*a* drives a plurality of pixels in a horizontal line and a vertical line, the AM driving method where each pixel is independently driven may need more wirings and contact pads. The TFT layer 23 may include a plurality of data signal lines arranged horizontally, a plurality of gate signal lines arranged vertically, and a plurality of pixel driving circuits 30 electrically connected to each line for controlling the plurality of pixels 100**.

The panel driver 40 may be directly bonded to the TFT substrate through a chip on glass (COG) or a chip on plastic (COP) bonding method. Alternatively, the panel driver 40 may be connected to the TFT substrate 20 through a separate flexible printed circuit board (PCB) (FPCB) by a film on glass (FOG) bonding method. The panel driver 40 may drive the plurality of pixel driving circuits and control light emission of the plurality of micro LEDs electrically connected to each of the plurality of pixel driving circuits 30.

The panel driver 40 may control the plurality of pixel driving circuit 30 for each line through a first driver 41 and a second driver 42. The first driver 41 may generate a control signal for sequentially controlling a plurality of horizontal lines formed on the TFT substrate 20 by one line each per image frame, and transmit the generated control signal to the pixel driving circuit 30 respectively connected to the line. The second driver 42 may generate a control signal for sequentially controlling a plurality of vertical lines formed on the TFT substrate 20 by one line each per image frame, and transmit the generated control signal to the pixel driving circuit 30 respectively connected to the line.

Figure 3:
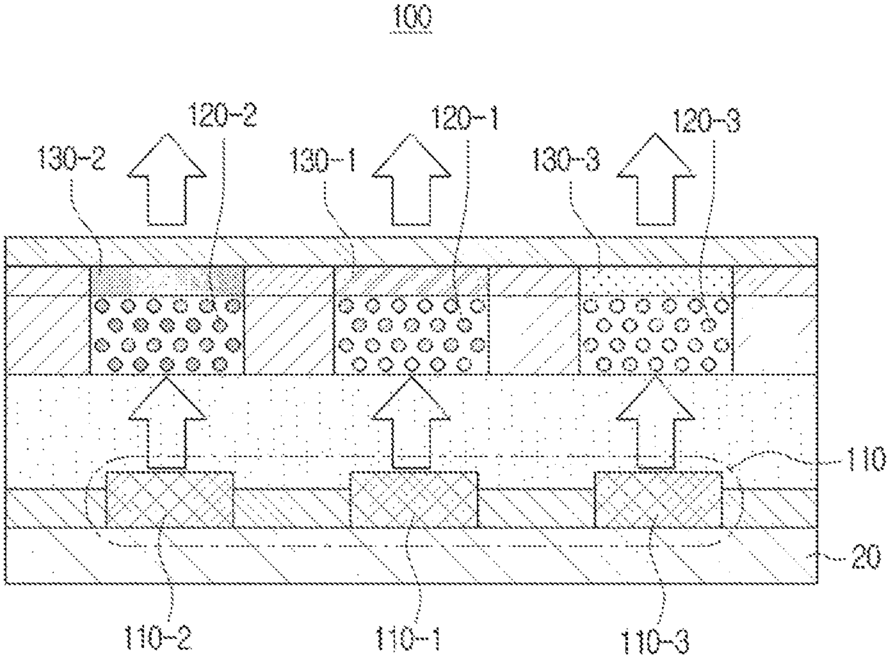
FIG. 3 is a diagram illustrating pixels included in a display module according to an embodiment of the disclosure.

FIG. 3 is a diagram illustrating a pixel 100 included in a display module according to an embodiment of the disclosure. As illustrated in FIG. 3, the pixel 100 may include a self-luminescence layer 110, first, second and third color conversion layers 120-1, 120-2, 120-3, and first, second and third color filters 130-1, 130-2, 130-3.

The self-luminescence layer 110 may emit light of a specific wavelength. In particular, as illustrated in FIG. 3, the self-luminescence layer 110 may include at least three self-luminescence elements 110-1, 110-2, 110-3. The at least three self-luminescence elements 110-1, 110-2, 110-3 may be implemented as micro LEDs, but are not limited thereto.

The first, second and third self-luminescence elements 110-1, 110-2, 110-3 may be electrically and physically connected to the TFT substrate 20 through an anisotropic conductive film (ACF) which was laminate-processed on the front surface of the TFT substrate 20. The first, second and third self-luminescence elements 110-1, 110-2, 110-3 may have a flip chip structure where two chip electrodes which are anode and cathode electrodes are formed on the opposite side of the light emitting surface.

The first, second and third self-luminescence elements 110-1, 110-2, 110-3 may include a square which has specific thickness and of which width and length are identical, or a rectangle of which width and length are different. In case the first, second and third self-luminescence elements 110-1, 110-2, 110-3 are implemented as micro LEDs, the first, second and third self-luminescence elements 110-1, 110-2, 110-3 may implement a real high dynamic range (HDR) and provide improved luminance and expressiveness of a black color, and a higher contrast ratio compared to OLEDs. The size of the micro LED may be less than or equal to 100 μm, or preferably less than or equal to 30 μm. In particular, the sizes of the first, second and third self-luminescence elements 110-1, 110-2, 110-3 may be identical.

The first, second and third self-luminescence elements 110-1, 110-2, 110-3 according to an embodiment of the disclosure may emit a deep blue light of a smaller wavelength than a wavelength of a blue light (about 460 nm). That is, the self-luminescence layer 110 may emit light of a wavelength of greater than 430 nm and less than 460 nm.

Specifically, a semiconductor material such as a quantum dot used in a color conversion layer has higher density in a higher energy state, and thus the semiconductor material may have higher absorbance in light of a lower wavelength.

Figure 4:
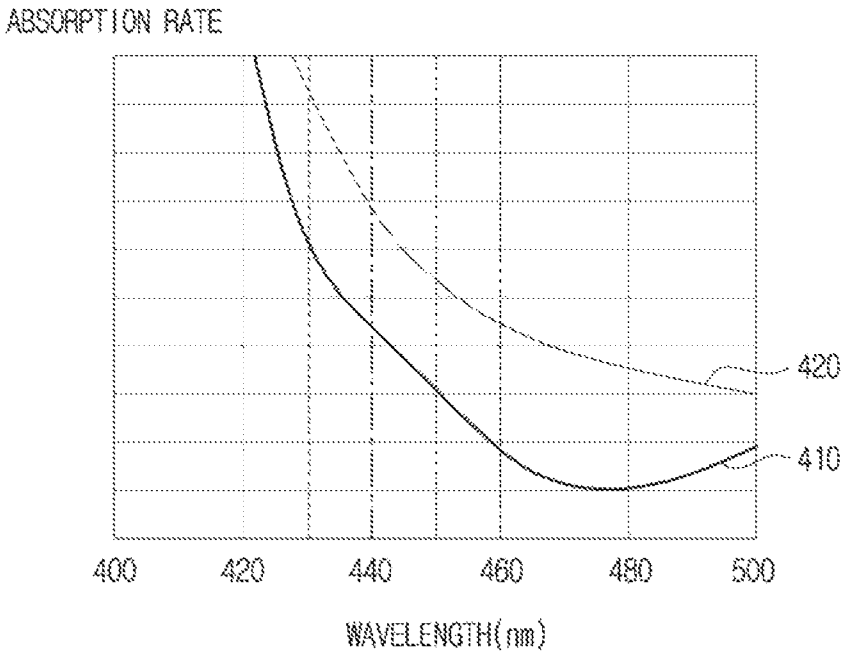
FIG. 4 is a graph illustrating a ratio of absorption rates of red/green quantum dots according to a wavelength of light emitted by a self-luminescence layer, according to an embodiment of the disclosure.

FIG. 4 is a graph illustrating a ratio of absorption rates of red/green quantum dots according to a wavelength of light emitted by a self-luminescence layer according to an embodiment of the disclosure.

As illustrated in FIG. 4, in the case of a deep blue light (light of a wavelength of greater than 430 nm and less than 460 nm) having a lower wavelength than a blue light (light of a wavelength of about 460 nm), both of the green quantum dot 410 and the red quantum dot 420 have higher absorption rates as the wavelength of light emitted from the self-luminescence layer 110 becomes lower. The ratio of the absorption rates of the red/green quantum dots according to the wavelength of light emitted from the self-luminescence layer 110 may be as in Table 1, based on a case where the wavelength of light emitted from the self-luminescence layer 110 is 460 nm.

TABLE 1

| | Ratio of Absorption Rates | |
|---|---|---|
| Wavelength | Green Quantum Dot | Red Quantum Dot |
| 460 nm | 100% | 100% |
| 450 nm | 164% | 118% |
| 440 nm | 234% | 153% |
| 430 nm | 331% | 209% |

That is, if self-luminescence elements emitting deep blue light are applied instead of self-luminescence elements emitting blue light, high light conversion efficiency may be secured with a smaller amount of red/green quantum dot materials.

The self-luminescence layer 110 may be implemented as InGaN semiconductor elements. In the case of self-luminescence elements emitting deep blue light, the ratio of In is low in the composition of InGaN compared to self-luminescence elements emitting blue light. In general, as the ratio of In inside InGaN semiconductor elements is higher, the external quantum efficiency of the elements decreases, and due to the reduction of the yield rate, the manufacturing unit cost may increase. Accordingly, in the case of applying self-luminescence elements emitting deep blue light according to embodiments of the disclosure, the light emitting efficiency of the display may additionally be improved by virtue of the improvement of the efficiency of the self-luminescence elements, and the manufacturing unit cost may also be reduced.

According to an embodiment of the disclosure, the ratio of In/Ga may be within 0.25 in the InGaN semiconductor elements. Specifically, the ratio of In+Ga and Na may be 1:1 in the InGaN semiconductor, and as the ratio of In increases, the wavelength of light emitted from the elements may increase. In particular, when the ratio of In and Ga is 0.2:0.8, the wavelength of light emitted from the elements is about 460 nm. Accordingly, for the wavelength of the InGaN semiconductor becomes less than or equal to 460 nm, the ratio of In/Ga may be 0.2/0.80 which is within 0.25 (e.g., about 1:4).

According to an embodiment of the disclosure, when considering the efficiency of the self-luminescence elements, the absorption rate of the color conversion layers, and harmfulness to human eyes comprehensively, the self-luminescence layer 110 may emit light of a wavelength of greater than 438 nm and less than 448 nm. That is, for improving the efficiency of the self-luminescence elements and the absorption rate of the color conversion layers, and not being harmful to human eyes, the self-luminescence layer 110 may emit light of a wavelength of greater than 438 nm and less than 448 nm.

The first, second and third color conversion layers 120-1, 120-2, 120-3 are arranged on the self-luminescence layer 110 as illustrated in FIG. 3, and may absorb light emitted from the self-luminescence layer 110 and convert the light into lights of different wavelength bands. As illustrated in FIG. 3, the first color conversion layer 120-1 (or the blue color conversion layer) may be arranged on the light emitting surface of the first self-luminescence element 110-1, the second color conversion layer 120-2 (or the red color conversion layer) may be arranged on the light emitting surface of the second self-luminescence element 110-2, and the third color conversion layer 120-3 (or the green color conversion layer) may be arranged on the light emitting surface of the third self-luminescence element 110-3.

The first color conversion layer 120-1 may include a color conversion material, which is a quantum dot or a phosphor of a turquoise color, for absorbing light emitted from the first self-luminescence element 110-1 and converting the light into blue light. Specifically, if a self-luminescence element emitting deep blue light is used, there is an advantage that the efficiency of the self-luminescence element becomes higher and the absorption rate of the color conversion layer becomes lower. However, since it is difficult for the display module 10 to reproduce a blue color, a problem that the color reproduction rate becomes lower may occur. For overcoming such a problem, if a color conversion material having a turquoise color is applied to the first color conversion layer 120-1, the deep blue light emitted from the self-luminescence element may be corrected to a blue color.

That is, the first color conversion layer 120-1 may include a quantum dot or a phosphor of a turquoise color that is excited by light of a deep blue wavelength band emitted from the first self-luminescence element 110-1 and may emit light of a blue wavelength band. The color conversion material included in the first color conversion layer 120-1 may be a quantum dot or a phosphor having a color of a wavelength of greater than 460 nm and less than 550 nm.

Figure 5:
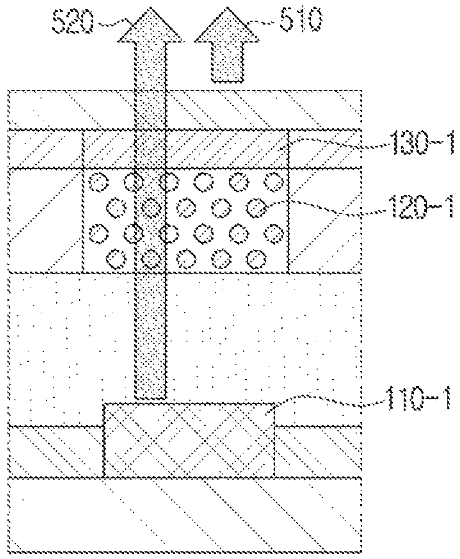
FIG. 5 is a diagram illustrating a mixed light of a converted light converted by a blue color conversion layer and light that was leaked without being absorbed into the blue color conversion layer, according to an embodiment of the disclosure.

FIG. 5 is a diagram illustrating a mixed light of a converted light converted by a blue color conversion layer and light that was leaked without being absorbed into the blue color conversion layer, according to an embodiment of the disclosure.

When a deep blue light emitted from the first self-luminescence element 110-1 passes through the first color conversion layer 120-1 and the first color filter 130-1, as illustrated in FIG. 5, a converted light 510 converted by the first color conversion layer 120-1 and leaked light 520 that was leaked without being absorbed into the first color conversion layer 120-1 may be generated. Then, the converted light 510 and the leaked light 520 may be mixed, and a mixed light may be generated. For the mixed light to become blue light, the strength of the light emitted from the self-luminescence element or the wavelength range of the phosphor included in the first color conversion layer may be adjusted.

Table 2 illustrates the ratio of the maximum strength of leaked light to converted light for producing a mixed light that is of a blue color, and the wavelength of the phosphor (or the quantum dot) included in the first color conversion layer 120-1 when the wavelength of light emitted from the self-luminescence element is greater than 438 nm and less than 448 nm according to an embodiment of the disclosure. The mixed light x and the mixed light y may be the x coordinate and the y coordinate on the CIE color coordinate.

TABLE 2

| Wavelength of light Emitted by the Self-luminescence Element | Greater than 438 nm and less than 448 nm | | | | |
|---|---|---|---|---|---|
| Ratio of the Maximum Strength (Leaked Light:Converted light) | 1:1 | 1:0.7 | 1:0.5 | 1:0.3 | 1:0.2 |
| Wavelength of the Phosphor (nm) | 469-483 | 474-488 | 479-493 | 489-503 | 499-513 |
| Mixed Light x | 0.140 | 0.141 | 0.144 | 0.148 | 0.150 |
| Mixed Light y | 0.053 | 0.056 | 0.057 | 0.058 | 0.059 |

That is, as the strength of the light emitted from the self-luminescence element is stronger, the wavelength of the phosphor may decrease, and as the strength of the light emitted from the self-luminescence element is weaker, the wavelength of the phosphor may increase.

Figure 6:
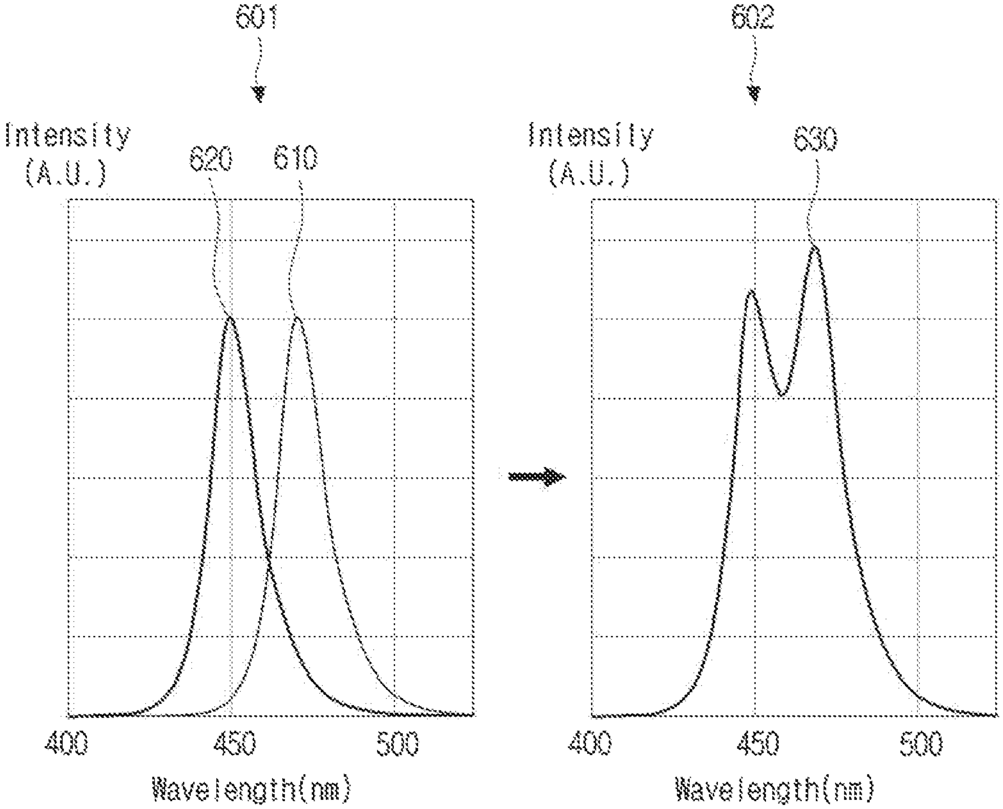
FIG. 6 is a diagram illustrating a spectrum of a converted light converted by a first color conversion layer, light that was leaked without being absorbed into the first color conversion layer, and a mixed light, according to an embodiment of the disclosure.

FIG. 6 is a diagram illustrating a spectrum of a converted light converted by the first color conversion layer 120-1, light that was leaked without being absorbed into the first color conversion layer 120-1, and a mixed light, according to an embodiment of the disclosure. FIG. 6 includes a first graph 601 and a second graph 602. Specifically, as illustrated in the first graph 601, in case the converted light 610 converted by the first color conversion layer 120-1 has a wavelength of 470 nm and the light 620 that was leaked without being absorbed into the first color conversion layer 120-1 has a wavelength of 450 nm, and the ratio of the maximum strength of the spectrum is 1:1. Thus, the spectrum of the mixed light 630 as shown in second graph 602 may be acquired. The mixed light 630 may be a blue light.

Figure 7:
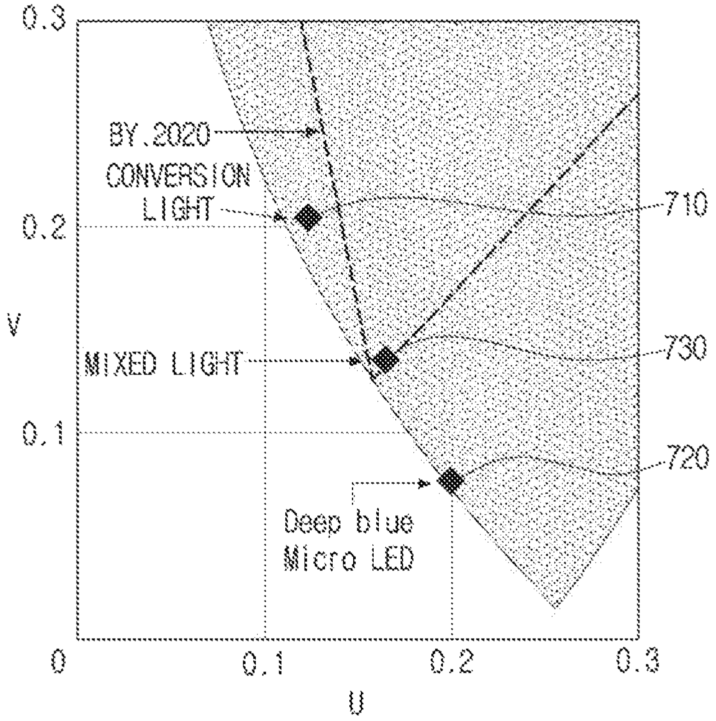
FIG. 7 is a diagram illustrating CIE coordinates for a converted light converted by a first color conversion layer, light that was leaked without being absorbed into the first color conversion layer, and a mixed light, according to an embodiment of the disclosure.

FIG. 7 is a diagram illustrating CIE coordinates for a converted light converted by the first color conversion layer 120-1, light that was leaked without being absorbed into the first color conversion layer 120-1, and a mixed light, according to an embodiment of the disclosure.

Specifically, in case the converted light converted by the first color conversion layer 120-1 has a wavelength of 470 nm, the light may be located on the first coordinate point 710, and in case the light that was leaked without being absorbed into the first color conversion layer 120-1 has a wavelength of 450 nm, the light may be located on the second coordinate point 720. In case the ratio of the maximum strength of the spectrum of the converted light and the leaked light is 1:1, the mixed light corresponding to third coordinate point 730 may be a blue light close to the BT 2020 standard, as illustrated in FIG. 7.

According to an embodiment of the disclosure, the strength of the peak wavelength of the spectrum of light converted by the first color conversion layer 120-1 may be 0.5 times to 2 times of the strength of the peak wavelength of the spectrum of light that was leaked without being absorbed into the first color conversion layer 120-1.

As described above, as the first color conversion layer 120-1 is implemented with a turquoise color conversion material, the wavelength of the deep blue light emitted by the first self-luminescence element 110-1 is corrected, and reduction of color reproductivity of the display module 10 may thereby be prevented.

Referring to FIG. 3, the second color conversion layer 120-2 may include a color conversion material emitting light of a red wavelength band, and the third color conversion layer 120-3 may include a color conversion material emitting light of a green wavelength band.

Specifically, the second color conversion layer 120-2 may include a phosphor (or a quantum dot) of a red color that is excited by light of a deep blue wavelength band emitted from the second self-luminescence element 110-2 and may emit light of a red wavelength band. Also, the third color conversion layer 120-3 may include a phosphor (or a quantum dot) of a green color that is excited by light of a deep blue wavelength band emitted from the third self-luminescence element 110-3 and may emit light of a green wavelength band.

As described above, the second and third self-luminescence elements 110-1, 110-2 emit a deep blue light having a smaller wavelength than a blue light, and thus the second and third color conversion layers 120-2, 120-3 may have better absorption rates compared to applying conventional self-luminescence elements emitting blue light.

Also, the pixel 100 may include first, second and third color filters 130-1, 130-2, 130-3 respectively corresponding to the first, second and third color conversion layers 120-1, 120-2, 120-3. Each of the first, second and third color filters 130-1, 130-2, 130-3 may be arranged on the first, second and third color conversion layers 120-1, 120-2, 120-3.

The first color filter 130-1 may be a blue color filter configured to pass through a wavelength of the same color as the color of the light of a blue wavelength band emitted from the first color conversion layer 120-1. The second color filter 130-2 may be a red color filter configured to pass through a wavelength of the same color as the color of the light of a red wavelength band emitted from the second color conversion layer 120-2. The third color filter 130-3 may be a green color filter configured to pass through a wavelength of the same color as the color of the light of a green wavelength band emitted from the third color conversion layer 120-3.

As described above, by applying self-luminescence elements emitting deep blue light of a lower wavelength than a blue light, the efficiency of the self-luminescence elements may be improved and the manufacturing unit cost may be reduced. Furthermore, as turquoise quantum dots are used in the color conversion layers, deep blue lights are corrected, and reduction of color reproductivity of the display module 10 may thereby be prevented.

In the above, each of the various embodiments of the disclosure was explained independently, but each embodiment does not necessarily have to be implemented solely, but the components and the operations of each embodiment may be implemented in combination with at least one other embodiment.

The embodiments of the disclosure disclosed in the specification and the drawings provide merely specific examples to easily describe technical content according to the embodiments of the disclosure and help the understanding of the embodiments of the disclosure, not intended to limit the scope of the embodiments of the disclosure. Accordingly, the scope of various embodiments of the disclosure should be interpreted as encompassing all modifications or variations derived based on the technical spirit of various embodiments of the disclosure in addition to the embodiments disclosed herein.

What is claimed is:

1. A display module, comprising:

a substrate; and a plurality of pixels provided on the substrate, wherein each of the plurality of pixels comprises:

a self-luminescence layer;

a first color conversion layer, a second color conversion layer, and a third color conversion layer provided on the self-luminescence layer, and a first color filter, a second color filter, and a third color filter provided on the first color conversion layer, the second color conversion layer, and the third color conversion layer, respectively, wherein the self-luminescence layer is configured to emit light of a wavelength that is less than or equal to 460 nm, wherein the first color conversion layer comprises a first color conversion material comprising a turquoise quantum dot or a turquoise phosphor configured to produce a color of a wavelength of greater than 460 nm and less than 550 nm, and wherein each of the plurality of pixels is configured produce blue light by mixing first light converted by the first color conversion layer and second light that was leaked through the first color conversion layer without being absorbed into the first color conversion layer.

2. The display module of claim 1, wherein the self-luminescence layer comprises:

at least one self-luminescence element configured to emit light of a wavelength greater than 430 nm and less than 460 nm.

3. The display module of claim 2, wherein the at least one self-luminescence element is configured to emit light of a wavelength greater than 438 nm and less than 448 nm.

4. The display module of claim 1, wherein the self-luminescence layer comprises InGaN semiconductor elements, and wherein a ratio of In:Ga in the InGaN semiconductor elements is about 1:4.

5. The display module of claim 1, wherein a first strength of a first peak wavelength of a spectrum of the first light converted by the first color conversion layer is 0.5 times to 2 times of a second strength of a second peak wavelength of a second spectrum of the second light that was leaked without being absorbed into the first color conversion layer.

6. The display module of claim 1, wherein the second color conversion layer comprises a second color conversion material configured to emit light of a red wavelength, and wherein the third color conversion layer comprises a third color conversion material configured to emit light of a green wavelength.

7. The display module of claim 6, wherein the second color conversion material comprises a red quantum dot or a red phosphor, and wherein the third color conversion material comprises a green quantum dot or a green phosphor.

8. A display module, comprising:

a substrate; and a plurality of pixels provided on the substrate, wherein each of the plurality of pixels comprises:

a self-luminescence layer comprising a first self-luminescence element;

a first color conversion layer corresponding to the first self-luminescence element; and a first color filter corresponding to the first color conversion layer, wherein the first self-luminescence element is configured to emit light of a wavelength that is less than or equal to 460 nm, wherein the first color conversion layer comprises a first color conversion material comprising a turquoise quantum dot or a turquoise phosphor configured to produce a color of a wavelength of greater than 460 nm and less than 550 nm, and wherein each of the plurality of pixels is configured produce blue light by mixing first light converted by the first color conversion layer and second light that was leaked through the first color conversion layer without being absorbed into the first color conversion layer.

9. The display module of claim 8, wherein the first self-luminescence element is configured to emit light of a wavelength between 430 nm and 460 nm.

10. The display module of claim 9, wherein the first self-luminescence element is configured to emit light of a wavelength between 438 nm and 448 nm.

11. The display module of claim 8, wherein a first strength of a first peak wavelength of a spectrum of the first light converted by the first color conversion layer is 0.5 times to 2 times of a second strength of a second peak wavelength of a second spectrum of the second light that was leaked without being absorbed into the first color conversion layer.

12. The display module of claim 8, wherein the self-luminescence layer further comprises a second self-luminescence element, wherein each of the plurality of pixels further comprises a second color conversion layer corresponding to the second self-luminescence element, and wherein the second color conversion layer comprises a second color conversion material configured to emit light of a red wavelength.

13. The display module of claim 12, wherein the second color conversion material comprises a red quantum dot or a red phosphor.

14. The display module of claim 12, wherein the self-luminescence layer further comprises a third self-luminescence element, wherein each of the plurality of pixels further comprises a third color conversion layer corresponding to the third self-luminescence element, and wherein the third color conversion layer comprises a third color conversion material configured to emit light of a green wavelength.

15. The display module of claim 14, wherein the third color conversion material comprises a green quantum dot or a green phosphor.

16. A pixel of a display module, the pixel comprising:

a self-luminescence layer;

a first color conversion layer, a second color conversion layer, and a third color conversion layer provided on the self-luminescence layer, and a first color filter, a second color filter, and a third color filter respectively provided on the first color conversion layer, the second color conversion layer, and the third color conversion layer, wherein the self-luminescence layer is configured to emit light of a wavelength that is less than or equal to 460 nm, wherein the first color conversion layer comprises a first color conversion material comprising a turquoise quantum dot or a turquoise phosphor configured to produce a color of a wavelength of greater than 460 nm and less than 550 nm, and wherein the pixel is configured produce blue light by mixing first light converted by the first color conversion layer and second light that was leaked through the first color conversion layer without being absorbed into the first color conversion layer.

* * * * *